United States Patent
Schwarz et al.

(10) Patent No.: US 9,450,608 B2
(45) Date of Patent: Sep. 20, 2016

(54) METHOD AND ARRANGEMENT FOR CODING TRANSFORM COEFFICIENTS IN PICTURE AND/OR VIDEO CODERS AND DECODERS AND A CORRESPONDING COMPUTER PROGRAM AND A CORRESPONDING COMPUTER-READABLE STORAGE MEDIUM

(75) Inventors: Heiko Schwarz, Berlin (DE); Detlef Marpe, Berlin (DE); Thomas Wiegand, Berlin (DE)

(73) Assignee: Faunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 2282 days.

(21) Appl. No.: 12/428,154

(22) Filed: Apr. 22, 2009

(65) Prior Publication Data

US 2009/0201986 A1 Aug. 13, 2009

Related U.S. Application Data

(63) Continuation of application No. PCT/EP03/04656, filed on May 2, 2003, and a continuation of application No. 10/727,802, filed on Dec. 4, 2003, now Pat. No. 7,702,013.

(30) Foreign Application Priority Data

May 2, 2002 (DE) ................... 102 20 961

(51) Int. Cl.
H04B 1/66 (2006.01)
H03M 7/40 (2006.01)
(Continued)

(52) U.S. Cl.
CPC ........... *H03M 7/4006* (2013.01); *H04N 19/60* (2014.11); *H04N 19/91* (2014.11); *H04N 19/93* (2014.11); *H04N 19/13* (2014.11); *H04N 19/136* (2014.11); *H04N 19/18* (2014.11)

(58) Field of Classification Search
CPC .................................................. H03M 7/4006
See application file for complete search history.

(56) References Cited

U.S. PATENT DOCUMENTS 5,278,646 A 1/1994 Civanlar et al.
5,473,376 A * 12/1995 Auyeung ................ H03M 7/42
348/403.1

(Continued)

OTHER PUBLICATIONS

Marpe et al., "A Highly Efficient Multiplication-Free Binary Arithmetic Coder and Its Application in Video Coding", IEEE, 2003, pp. 1-4.

(Continued)

*Primary Examiner* — William C Vaughn, Jr.
*Assistant Examiner* — Luis Perez Fuentes
(74) *Attorney, Agent, or Firm* — Laurence A. Greenberg; Werner H. Stemer; Ralph E. Locher

(57) ABSTRACT

The present invention describes a method and an arrangement for coding transform coefficients in picture and/or video coders and decoders and a corresponding computer program and a corresponding computer-readable storage medium, which can particularly be employed as a novel efficient method for binary-arithmetic coding transform coefficients in the field of video coding.

For this, it is suggested that, for blocks of (video) pictures containing significant transform coefficients, coding of the transform coefficients takes place in such a way that, for each block in a scan process, the positions of significant transform coefficients in the block and subsequently, in a reverse scan order—starting from the last significant transform coefficient within the block—the values (levels) of the significant transform coefficients are determined and coded.

29 Claims, 5 Drawing Sheets

(51) Int. Cl.
H04N 19/60 (2014.01)
H04N 19/91 (2014.01)
H04N 19/93 (2014.01)
H04N 19/13 (2014.01)
H04N 19/136 (2014.01)
H04N 19/18 (2014.01)

(56) References Cited

U.S. PATENT DOCUMENTS

| | | | |
|---|---|---|---|
| 5,576,765 A | 11/1996 | Cheney et al. | |
| 5,818,877 A * | 10/1998 | Tsai | H03M 7/40 341/106 |
| 6,304,607 B1 * | 10/2001 | Talluri | G06T 9/005 375/240.27 |
| 6,466,698 B1 * | 10/2002 | Creusere | G06T 9/007 375/240.19 |
| 6,483,946 B1 * | 11/2002 | Martucci et al. | 382/240 |
| 6,546,145 B1 | 4/2003 | Miyake et al. | |
| 6,577,251 B1 | 6/2003 | Yip | |
| 6,812,873 B1 | 11/2004 | Siohan et al. | |
| 6,819,803 B2 | 11/2004 | Mitchell et al. | |
| 6,856,701 B2 * | 2/2005 | Karczewicz | H04N 19/176 375/E7.144 |
| 6,859,561 B2 | 2/2005 | Mitchell et al. | |
| 7,190,840 B2 * | 3/2007 | Said | H04N 19/129 375/E7.069 |
| 7,369,709 B2 | 5/2008 | Hsu et al. | |
| 2005/0117652 A1 | 6/2005 | Schwarz et al. | |

OTHER PUBLICATIONS

Marpe et al., "Proposed Editorial Changes and Cleanup of CABAC" Joint Video Team (JVT) of ISO/IEC MPEG & ITU-T VCEG (ISO?IEC JTC1/SC29/WG11 and ITU-T SG16 Q.6), Jul. 2002, pp. 1-10.
Wiegand, Study of Final Committee Draft of Joint Video Specification (ITU-T Rec. H.264—ISO/IEC 14496-10 AVC) Joint Video Team (JVT) of ISO/IEC MPEG & ITU-T VCEG (ISO/IEC JTC1/SC29/WG11 and ITU-T SG16 Q.6), Dec. 2002, pp. 1-239.
Marpe et al., "Video Compression using Context-Based Adaptive Arithmetic Coding", IEEE 2001, pp. 558-561.
Moffat et al., "Compression and Cooling Algorithms", Chapter 3, Static Codes, Kluwer Academic Publishers, Boston, 2002, pp. 29-50, XP-002312370.
Bell et al.: "Compression of Sparse Matrices by Arithmetic Coding" Data Compression Conference, 1998, DCC '98 Proceedings, Snowbird, UT, USA, Mar. 30-Apr. 1, 1998, IEEE Press, Mar. 30, 1998, pp. 23-32, XP010276609.
Bjontegaard, "Improved low complexity entropy coding for transform coefficients", Joint Video Team (JVT) of ISO/IEC MPEG & ITU-T VCEG (ISO/IEC JTC1SC29/WG11 and ITU-T SQ16 0.6), 2nd Meeting: Geneva, CH, Jan. 29 2002, pp. 1-8, XP002257294.
Wiegand, Draft ITU-T Recomendation and Final Draft International Standard of Joint Video Specification (ITU-T Rec.. H.264/ ISO/IEC 14496-10 AVC), Joint Video Team (JVT) of ISO/IEC MPEG & ITU-VCEG (ISO/IEC JTC1SC29/WG11 and ITU-T SQ16 Q.6), 7th Meeting: Pattaya, Thailand, Mar. 7-14, 2003, pp. 1-250.
Wiegand et al., "Overview of the H.264/AVC Video Coding Standard" IEEE Transactions on Circuits and Systems for Video TEchnology, vol. 13, No. 7, Jul. 2003, pp. 560-576.
Wiegand et al, "Overview of the H.264/AVC Video Coding Standard", Information Technology-Generic Coding Moving Pictures and Associated Audio Information: Video, International Standard 13818-2 Recomendation ITU-T H.262, 1995, 239 pages.
Sullivan, Draft Text Recommendation H.263 Version 2 ("H.263+") for Decision, International Telecommunication Union, Tlecommunication Standardization Sector, Study Period 1997-2000, pp. 1-143.
Information Technology—Coding of Audio-Visual Objects—Part 2: Visual, International Organization for Standardization, Organization International Normalization ISO/IEC JTC 1/SC 29/WG 11, Coding of moving pictures and audio, Jul. 2001, Sydney, Australia, pp. 1-526.
Gonzales El al., DCT Coding for Motion Video Storage Using Adaptive Arithmetic Coding, Signal Processing: Image Communication 2, 1990, pp. 145-154.
Marpe et al., "Adaptive Codes for H.26L", ITU—Telecommunication Standardization Sector, Study Group 16 Question 6, Video Coding Experts Group (VCEG), Jan. 2001, pp. 1-7.
Marpe et al., "Further Results for CABAC entropy coding scheme", ITU—Telecommunication Standardization Sector, Study Group 16 Question 6, Video Coding Experts Group (VCEG), Mar. 2001, pp. 1-8.
Schwarz et al., "Improved CABAC", Joint Video Team (JVT) of ISO/IEC MPEG & ITU-T VCEG (ISO/IEC JTC1SC29/WG11 and ITU-T SG16 Q.6), May 2002, pp. 1-6.
Marpe et al., "New Results on Improved CABAC", Joint Video Team (JVT) of ISO/IEC MPEG & ITU-T VCEG (ISO/IEC JTC1/SC29/WG11 and ITU-T SG16 Q.6), 2002, pp. 1-12.
Marpe et al., "Improved CABAC", ITU—Telecommunications Standardization Sector, Study Group 16 Question 6, Video Coding Experts Group (VCEG), Nov. 27, 2001, pp. 1-9.
Marpe et al, "Fast Arithmetic Coding for CABAC", Joint Video Team (JVT) of ISO/IEC MPEG & ITU-T VCEG (ISO/IEC JTC1/SC29/WG11 and ITU-T SG 16 Q.6), 2002, pp. 1-11.
Schwarz et al., "CABAC and Slices" Joint Video Team (JVT) of ISO/IEC MPEG & ITU-T VCEG (ISO/IEC JTC1/SC29/WG11 and ITU-T SG 16 Q.6), 2002, pp. 1-11.
Karzewicz et al., "Analysis and Simplification of Intra Prediction" Joint Video Team (JVT) of ISO/IEC MPEG & ITU-T VCEG (ISO/IEC JTC1/SC29/WG11 and ITU-T SG 16 Q.6), 2002, 8 pages.
Marpe et al., "Proposed Cleanup Changes for CABAC" Joint Video Team (JVT) of ISO/IEC MPEG & ITU-T VCEG (ISO/IEC JTC1/SC29/WG11 and ITU-T SG 16 Q.6), 2002, 7 pages.
Bossen, "CABAC Cleanup and Complexity Reduction" Joint Video Team (JVT) of ISO/IEC MPEG & ITU-T VCEG (ISO/IEC JTC1/SC29/WG11 and ITU-T SG 16 Q.6), 2002, 20 pages.
Marpe et al., "Final CABAC Cleanup", Joint Video Team (JVT) of ISO/IEC MPEG & ITU-T VCEG (ISO/IEC JTC1/SC29/WG11 and ITU-T SG 16 Q.6), 2002, 25 pages.
Marpe et al., "Very Low Bit-Rate Video Coding Using Wavelet-Based Techniques", IEEE Transactions on Circuits and Systems for Video Technology, vol. 9, No. 1, Feb. 1999, pp. 85-94.
Heising et al., "Wavelet-based very low bit-rate video coding using image warping and overlapped block motion compensation", IEE, 2001, pp. 93-101.
Choi et al., "Motion-Compesated 3-D Subband Coding of Video", IEEE Transactions on Image Processing, vol. 8, No. 2, Feb. 1999, pp. 155-167.
Said et al., "A New Fast and Efficient Image Codec Based on Set Partioning in Hierarchical Trees", Manuscript submitted to the IEEE Transactions on Circuits and Systems for Video Technology presented in part at the IEEE Ont. Symp. on Circuites and Systems, Chicago, IL, May 1993, pp. 1-15.
Marpe et al., Efficient Pre-Coding Techniques for Wavelet-Based Image Compression Fachhochschule für Technik und Wirtschaft Berlin, Germany, pp. 45-51.
Rissanen et al., "Universal Modeling and Coding", IEEE Transactions on Information Theory, vol. IT-27, No. 1, Jan. 1981, pp. 12-23.
Rissanen, "Universal Coding, Information, Prediction, and Estimation", EEE Transactions on Information Theory, vol. IT-30, No. 4, Jul. 1984, pp. 629-636.
Weinberger et al., "Applications of Universal Context Modeling to Lossless Compression of Gray-Scale Images", IEEE Transactions on Image Processing, vol. 5, No. 4, Apr. 1996, pp. 575-586.
Teuhola, "A Compression Method for Clustered Bit-Vectors", Information Processing Letters, vol. 7, No. 6, Oct. 1878, Department of Computer Science, Univesity of Turku, Finland, pp. 308-311.
Gallager et al., "Optimal Source Codes for Geometrically Distributed Integer Alphabets", IEEE Transactions on Information Theory, Mar. 1975, pp. 228-230.
Pennebaker et al., "An overview of the basic principles of the Q-Coder adaptive binary arithmetic coder", IBM J. Res. Develop. vol. 32, No. 6, Nov. 1988, pp. 717-726.

(56) References Cited

OTHER PUBLICATIONS

Mrak et al., "A Context Modeling Algorithm and its Application in Video Compression", University of Zagreb, Faculty of Electrical Engineering and Computing, 8 pages.

Rissanen et al., "A Multiplication-Free Multialphabet Arithmetic Code", IEEE Transactions on Communications, vol. 37, No. 2, Feb. 1989, pp. 93-98.

Howard et al., "Practical Implementations of Arithmetic Coding" Brown University, Department of Computer Science, Technical Report No. 92-18, Revised version, Apr. 1992, pp. 1-30.

Sample Data Coding, Chapter 12, pp. 474-484.

Moffat et al, "Arithmetic Code Revisited", ACM Transactions on Information Systems, vol. 16, No. 3, Jul. 1998, pp. 256-294.

Wiegand et al., "Rate-Constrained Coder Control and Comparison of Video Coding Standards" IEEE Transactions on Circuits and Systems for Video Technology, vol. 13, No. 7, Jul. 2003, pp. 688-703.

ITU-T H.261, Line Transmission of Non-Telephone Signals—Video Codec for Audiovisual Services AT p x 64 kbits, ITU-T Recomendation H.261 Mar. 1993, pp. 1-25.

Wenger, "H.264/AVC Over IP", IEEE Transactions on Circuits and Systems for Video Technology, vol. 13, No. 7, Jul. 2003, pp. 645-656.

Stockhammer et al., "H.264/AVC in Wireless Environments", IEEE Transactions on Circuits and Systems for Video Technology, vol. 13, No. 17, Jul. 2003, pp. 657-673.

Wedi et al., "Motion- and Aliasing-Compensated Prediction for Hybrid Video Coding" IEEE Transactions on Circuits and Systems for Video Technology, vol. 13, No. 7, Jul. 2003, pp. 577-586.

Wiegand et al, "Long-Term Memory Motion-Compensated Prediction" IEEE Transactions on Circuits and Systems for Video Technology, vol. 9, No. 1, Feb. 1999, pp. 70-84.

Flierl et al., "A Locally Optimal Design Algorithm for Block-Based Multi-Hypothesis Motion-Compensated Prediction", in Proceedings of the IEEE DCC, pp. 239-248, Snowbird, Utah, Mar. 1998.

Flierl et al., "Generalized B Pictures and the Draft H.264/AVC Video-Compression Standard", IEEE Transactions on Circuits and Systems for Video Technology, vol. 13, No. 7, Jul. 2003, pp. 587-597.

Karczewicz et al., "The SP- and SI-Frames Design for H.264/AVC" IEEE Transactions on Circuits and Systems for Video Technology, vol. 13, No. 7, Jul. 2003, pp. 637-644.

Marpe et al, "Context-Based Adaptive Binary Arithmetic Coding in the H.264/AVC Video Compression Standard" IEEE Transactions on Circuits and Systems for Video Technology, vol. 13, No. 7, Jul. 2003, pp. 620-636.

Malvar et al., "Low-Complexity Transform and Quantization in H.264/AVC" IEEE Transactions on Circuits and Systems for Video Technology, vol. 13, No. 7, Jul. 2003, pp. 598-603.

List et al., "Adaptive Deblocking Filter" IEEE Transactions on Circuits and Systems for Video Technology, vol. 13, No. 7, Jul. 2003, pp. 614-619.

Ribas-Corbera et al., "A Generalized Hypothetical Reference Decoder for H.264/AVC" IEEE Transactions on Circuits and Systems for Video Technology, vol. 13, No. 7, Jul. 2003, pp. 674-687.

Wiegand et al., Draft ITU-T REcomendation and Final Draft International Standard of Joint Video Specification (ITU-T Rec. H.264—ISO/IEC 14496-10 AVC) Joint Video Team (JVT) of ISO/IEC MPEG & ITU-T VCEG (ISO/IEC JTC1SC29/WG11 and ITU-T SG16 Q.6), 8th Meeting: Geneva, Switzerland, May 23-27, 2003, pp. 1-253.

* cited by examiner

| coefficients | 14 | 0 | -5 | 3 | 0 | 0 | -1 | 0 | 1 | 0 | 0 | 0 | 0 | 0 |
|---|---|---|---|---|---|---|---|---|---|---|---|---|---|---|
| SIG | 1 | 0 | 1 | 1 | 0 | 0 | 1 | 0 | 1 | | | | | |
| LAST | 0 | 0 | 0 | 0 | 0 | 0 | 0 | 0 | 1 | | | | | |

| coefficients | 18 | -2 | 0 | 0 | 0 | -5 | 1 | 1 | -1 | 0 | 0 | 1 | 0 | 0 | 0 | 1 |
|---|---|---|---|---|---|---|---|---|---|---|---|---|---|---|---|---|
| SIG | 1 | 1 | 0 | 0 | 0 | 1 | 1 | 1 | 1 | 0 | 0 | 1 | 0 | 0 | 0 | (1) |
| LAST | 0 | 0 | 0 | 0 | 0 | 0 | 0 | 0 | 0 | 0 | 0 | (1) | | | | |

FIG. 2

| ABS | binarization |||||||||||||||||||
|---|---|---|---|---|---|---|---|---|---|---|---|---|---|---|---|---|---|---|---|
| | unary part |||||||||||||| Exp-Golomb part |||||
| 1  | 0 | | | | | | | | | | | | | | | | | | |
| 2  | 1 | 0 | | | | | | | | | | | | | | | | | |
| 3  | 1 | 1 | 0 | | | | | | | | | | | | | | | | |
| 4  | 1 | 1 | 1 | 0 | | | | | | | | | | | | | | | |
| 5  | 1 | 1 | 1 | 1 | 0 | | | | | | | | | | | | | | |
| 6  | 1 | 1 | 1 | 1 | 1 | 0 | | | | | | | | | | | | | |
| 7  | 1 | 1 | 1 | 1 | 1 | 1 | 0 | | | | | | | | | | | | |
| 8  | 1 | 1 | 1 | 1 | 1 | 1 | 1 | 0 | | | | | | | | | | | |
| 9  | 1 | 1 | 1 | 1 | 1 | 1 | 1 | 1 | 0 | | | | | | | | | | |
| 10 | 1 | 1 | 1 | 1 | 1 | 1 | 1 | 1 | 1 | 0 | | | | | | | | | |
| 11 | 1 | 1 | 1 | 1 | 1 | 1 | 1 | 1 | 1 | 1 | 0 | | | | | | | | |
| 12 | 1 | 1 | 1 | 1 | 1 | 1 | 1 | 1 | 1 | 1 | 1 | 0 | | | | | | | |
| 13 | 1 | 1 | 1 | 1 | 1 | 1 | 1 | 1 | 1 | 1 | 1 | 1 | 0 | | | | | | |
| 14 | 1 | 1 | 1 | 1 | 1 | 1 | 1 | 1 | 1 | 1 | 1 | 1 | 1 | 0 | | | | | |
| 15 | 1 | 1 | 1 | 1 | 1 | 1 | 1 | 1 | 1 | 1 | 1 | 1 | 1 | 1 | 0 | | | | |
| 16 | 1 | 1 | 1 | 1 | 1 | 1 | 1 | 1 | 1 | 1 | 1 | 1 | 1 | 1 | 1 | 0 | 0 | | |
| 17 | 1 | 1 | 1 | 1 | 1 | 1 | 1 | 1 | 1 | 1 | 1 | 1 | 1 | 1 | 1 | 0 | 1 | | |
| 18 | 1 | 1 | 1 | 1 | 1 | 1 | 1 | 1 | 1 | 1 | 1 | 1 | 1 | 1 | 1 | 1 | 0 | 0 | 0 |
| 19 | 1 | 1 | 1 | 1 | 1 | 1 | 1 | 1 | 1 | 1 | 1 | 1 | 1 | 1 | 1 | 1 | 0 | 0 | 1 |
| 20 | 1 | 1 | 1 | 1 | 1 | 1 | 1 | 1 | 1 | 1 | 1 | 1 | 1 | 1 | 1 | 1 | 0 | 1 | 0 |
| 21 | 1 | 1 | 1 | 1 | 1 | 1 | 1 | 1 | 1 | 1 | 1 | 1 | 1 | 1 | 1 | 1 | 0 | 1 | 1 |
| ... | ... | ... | ... | ... | ... | ... | ... | ... | ... | ... | ... | ... | ... | ... | ... | ... | ... | ... | ... |
| bin | 1 | 2 | 3 | 4 | 5 | 6 | 7 | 8 | 9 | 10 | 11 | 12 | 13 | 14 | 15 | 16 | 17 | 18 | 19 ... |

FIG. 3

| block types | coefficient number | category |
|---|---|---|
| DC luminance block (INTRA 16x16-Mode) | 16 | 0: Luma-Intra 16-DC |
| AC luminance block (INTRA 16x16-Mode) | 15 | 1: Luma-Intra 16-AC |
| luminance block (INTRA 4x4-Mode) | 16 | 2: Luma-4x4 |
| luminance block (INTER-Mode) | 16 | |
| DC-chrominance-U-block (INTRA-Mode) | 4 | 3: Chroma-DC |
| DC-chrominance-V-block (INTRA-Mode) | 4 | |
| DC-chrominance-U-block (INTER-Mode) | 4 | |
| DC-chrominance-V-block (INTER-Mode) | 4 | |
| AC-chrominance-U-block (INTRA-Mode) | 15 | 4: Chroma-AC |
| AC-chrominance-V-block (INTRA-Mode) | 15 | |
| AC-chrominance-U-block (INTER-Mode) | 15 | |
| AC-chrominance-V-block (INTER-Mode) | 15 | |

FIG. 4

| coefficients | 14 | 0 | -5 | 3 | 0 | 0 | -1 | 0 | 1 |
|---|---|---|---|---|---|---|---|---|---|
| ctx_number_abs_1bin | 4 | | 4 | 2 | | | 1 | | 0 |
| ctx_number_abs_rbins | 2 | 1 | 0 | | | | | | |

↓ reversed scan direction

| coefficients | 18 | -2 | -1 | 4 | 6 | 4 | -5 | 1 | -1 | 0 | 1 | 0 | 0 | 1 |
|---|---|---|---|---|---|---|---|---|---|---|---|---|---|---|
| ctx_number_abs_1bin | 4 | | | 4 | 4 | 4 | 3 | 3 | | | 2 | | | 0 |
| ctx_number_abs_rbins | 4 | 3 | | 3 | 2 | 1 | 0 | | | | | | | |

METHOD AND ARRANGEMENT FOR CODING TRANSFORM COEFFICIENTS IN PICTURE AND/OR VIDEO CODERS AND DECODERS AND A CORRESPONDING COMPUTER PROGRAM AND A CORRESPONDING COMPUTER-READABLE STORAGE MEDIUM

CROSS-REFERENCE TO RELATED APPLICATION

This application is a continuation of copending U.S. patent application Ser. No. 10/727,802, filed on Dec. 4, 2003, which is a continuation of International Application No. PCT/EP03/04656, filed May 2, 2003, which designated the United States and was not published in English.

BACKGROUND OF THE INVENTION

1. Field of the Invention

The present invention describes a method and an arrangement for coding transform coefficients in picture and/or video coders and decoders and a corresponding computer program and a corresponding computer-readable storage medium, which can particularly be employed as a novel efficient method for binary-arithmetic coding transform coefficients in the field of video coding (CABAC in H.264/AVC cf. [1]).

2. Description of the Related Art

In present hybrid block-based standards for video coding, such as, for example, MPEG-2 [2], H.263 [3] and MPEG-4 [4], the blocks of quantized transform coefficients (levels) are mapped by a defined scan process to a vector which is coded to code words having a variable length by using a run-length coding and subsequent mapping.

In MPEG-2 [2], the code words having a variable length are associated to two-dimensional events (RUN, LEVEL), wherein LEVEL represents the quantized value of a (significant) transform coefficient not quantized to zero; the run-length RUN indicates the number of subsequent (non-significant) transform coefficients quantized to zero, which, in the vector of transform coefficients, are immediately in front of the present significant transform coefficients. In addition, code words having a variable length are defined for the two special events EOB and ESCAPE. While the EOB event indicates that there are no further significant transform coefficients in the block, the ESCAPE event signals that the existing event (RUN, LEVEL) cannot be represented by the defined alphabet of code words having a variable length. In this case, the symbols RUN and LEVEL are coded by code words of a fixed length.

In the newer coding standards H.263 [3] and MPEG-4 [4], the association of code words having a variable length takes place on the basis of three-dimensional events (LAST, RUN, LEVEL), wherein the binary symbol LAST indicates whether the present significant transform coefficient is the last significant coefficient within the block or whether further significant transform coefficients follow. By using these three-dimensional events, no additional EOB event is required; an ESCAPE event is used in analogy to MPEG-2, wherein the binary symbol LAST is coded additionally to RUN and LEVEL.

The coding of the transform coefficients realized in MPEG-2, H.263 and MPEG-4 has the following disadvantages:

To each coding event only a code word having an integer length can be associated, an efficient coding of events with probabilities larger than 0.5 cannot take place.

The usage of a fixed table for mapping the coding events to the code word having a variable length for all the transform coefficients within a block does not consider symbol statistics depending on position or frequency. Adaptation to the actually existing symbol statistics is not possible.

No usage is made of inter-symbol redundancies present.

Annex E of the H.263 standard specifies an optional non-adaptive arithmetic coding in which different predetermined model probability distributions are used, one each for the first, second and third event (LAST, RUN, LEVEL)/ESCAPE another one for all the following events (LAST, RUN, LEVEL)/ESCAPE of a block of transform coefficients, as well as one each for the symbols LAST, RUN and LEVEL, which are coded after an ESCAPE event.

For the following reasons no appreciable increase of the coding efficiency is, however, possible by this optional arithmetic coding:

The advantage of arithmetic coding that a code word having a non-integer length can be associated to a coding event hardly has any effect on the coding efficiency by using combined events of the form (LAST, RUN, LEVEL).

The advantage of using different probability distributions is eliminated by the fact that adaptation to the actually present symbol statistics is not possible.

One of the first published methods for coding transform coefficients by an adaptive binary arithmetic coding in a hybrid video coder ensuring the adaptation of probabilities to the symbol statistics present has been presented in [5].

In H.264/AVC [1], a context-adaptive method on the basis of code words having a variable length for coding transform coefficients is specified as the standard method for entropy coding. Here, the coding of a block of transform coefficients is determined by the following characteristics:

Both the number of the significant coefficients within a block and the number of subsequent coefficients quantized to one at the end of the vector of transform coefficients are determined by a symbol COEFF_TOKEN. Depending on the block type and the symbols COEFF_TOKEN already coded/decoded for neighboring blocks, one of five defined code word tables is chosen for coding.

While for the transform coefficients quantized to one at the end of the coefficient vector only a single bit is transferred for specifying the sign, the coding of the values (levels) of the remaining significant transform coefficients takes place in a reverse scan order by means of a combined prefix suffix code word.

If the number of significant transform coefficients is smaller than the number of transform coefficients for the corresponding block, a symbol TOTAL_ZEROS will be coded, which indicates the number of transform coefficients quantized to zero which, in the coefficient vector, are in front of the last significant coefficient. For this, 18 code word tables have been specified, which are switched depending on the number of significant coefficients and the block type.

The run-length of the (non-significant) coefficients quantized to zero (RUN) in front of a significant coefficient is coded for each significant transform coefficient in a reverse scan order as long as the sum of RUNs already coded is smaller than TOTAL_ZEROS. Depending on TOTAL_ZEROS and the RUNs already coded/decoded, switching between seven code word tables takes place.

Although this so-called CAVLC method (CAVLC: context-adaptive variable length coding), by context based switching the code word tables, allows a considerably more efficient coding of the transform coefficients than the methods specified in MPEG-2, H.263 and MPEG-4, it basically has the following disadvantages:

Switching between different code word tables takes place depending on symbols already coded/decoded, the code word tables, however, cannot be adjusted to the actual symbol statistics.

By using code words having a variable length, events having symbol probabilities larger than 0.5 cannot be coded efficiently. This limitation especially prevents coding symbols having a smaller value range, by means of which a construction of suitable contexts might be possible for switching between different model probability distributions.

A possible solution for avoiding the disadvantages illustrated of well-known methods for coding transform coefficients in block-based picture and video coders is a combination of an adaptive arithmetic coding and a suitable context generation for using the inter-symbol redundancies. Since the more complicated computing of the arithmetic coding, compared to coding by means of code words having a variable length, is a disadvantage, the possibility of an efficient hardware and software implementation must be considered particularly.

SUMMARY OF THE INVENTION

Thus, it is the object of the present invention to provide a method and an arrangement for coding transform coefficients in picture and/or video coders and decoders and a corresponding computer program and a corresponding computer-readable storage medium, which eliminate the deficiencies mentioned above and, in particular, keep the amount of calculating required for coding small.

In accordance with a first aspect, the present invention provides a method for coding transform coefficients in picture and/or video coders and decoders, wherein for blocks of (video) pictures containing significant transform coefficients, the coding of transform coefficients takes place in such a way that, for each block, in a scan process, the positions of significant transform coefficients in the block and subsequently, in a reverse scan order—starting with the last significant transform coefficients within the block—the values (levels) of the significant transform coefficients are determined and coded.

One preferred embodiment of the inventive method is characterized by each significant transform coefficient of the block other than the last transform coefficient of the block being characterized by a one-bit symbol.

It is also of advantage if the sign for each significant transform coefficient is indicated by a one-bit symbol (SIGN) and the magnitude is indicated by a binary coded symbol (ABS).

In one preferred embodiment of the inventive method, blocks containing significant transform coefficients are characterized by a one-bit symbol CBP4 in connection with other syntax elements, such as, for example, CBP or macro block mode.

It is a special advantage of the method that, by transferring a one-bit symbol SIG for each coefficient of a block and of a one-bit symbol LAST for each significant coefficient of a block, a significance mapping is coded, wherein the transfer takes place in the scan order, SIG serves for identifying significant coefficients and LAST indicates whether there are further significant transform coefficients in the block.

In another preferred embodiment of the inventive method, modeling for the one-bit symbol CBP4, for coding the significance mapping and/or for coding the coefficient magnitudes takes place in a context-dependent way. Thus, block types of transform coefficients having comparable statistics are summarized to block categories.

It is also of advantage that, in a special embodiment of the inventive method, no significance information (SIG, LAST) is transferred for the last scan position of a block.

In a preferred embodiment of the inventive method, the magnitude (ABS) is indicated by a symbol in unary binarization or by a symbol having a prefix part and a suffix part, wherein the prefix part consists of ones and the suffix part is coded in a 0th order exp-golomb code.

In accordance with a second aspect, the present invention provides an arrangement having at least one processor and/or chip formed such that method for coding transform coefficients in picture and/or video coders and decoders can be performed, wherein for blocks of (video) pictures containing significant transform coefficients, the coding of transform coefficients takes place in such a way that, for each block, in a scan process, the positions of significant transform coefficients in the block and subsequently, in a reverse scan order—starting with the last significant transform coefficients within the block—the values (levels) of the significant transform coefficients are determined and coded.

In accordance with a third aspect, the present invention provides a computer program enabling a computer, after having been loaded into the memory of the computer, to perform a method for coding transform coefficients in picture and/or video coders and decoders, wherein for blocks of (video) pictures containing significant transform coefficients, the coding of transform coefficients takes place in such a way that, for each block, in a scan process, the positions of significant transform coefficients in the block and subsequently, in a reverse scan order—starting with the last significant transform coefficients within the block—the values (levels) of the significant transform coefficients are determined and coded.

Such computer programs can, for example, (for a fee or free of charge, freely accessible or protected by a password) be provided in a data or communication network for downloading. The computer programs provided in this way can then be utilized by a method in which a computer program according to claim 11 is downloaded from a network for transfer, such as, for example, from the Internet, to data processing means connected to the network.

In accordance with a fourth aspect, the present invention provides a computer-readable storage medium on which a program is stored, enabling a computer, after having been loaded into the memory of the computer, to perform a method for coding transform coefficients in picture and/or video coders and decoders, wherein for blocks of (video) pictures containing significant transform coefficients, the coding of transform coefficients takes place in such a way that, for each block, in a scan process, the positions of significant transform coefficients in the block and subsequently, in a reverse scan order—starting with the last significant transform coefficients within the block—the values (levels) of the significant transform coefficients are determined and coded.

The novel method for coding transform coefficients is especially characterized by the following characteristics:

A two-dimensional block of transform coefficients is mapped to a one-dimensional vector by a scan process.

The syntax elements of the EOB symbol, the LAST symbol or the coefficient counter (number of significant coefficients) as well as RUN (number of non-significant coefficients in the scan order) used in well-known methods are replaced by a one-bit symbol CBP4 and a significance mapping.

The levels (magnitudes of the significant coefficients) are coded in a reverse scan order.

Context modeling takes place in a novel manner.

BRIEF DESCRIPTION OF THE SEVERAL VIEWS OF THE DRAWING

Preferred embodiments of the present invention will be detailed subsequently referring to the appended drawings, in which:

FIG. 2 shows two examples for coding the significance mapping (the yellow marked symbols are not transferred), FIG. 3 shows binarization for the magnitudes of the transform coefficients (ABS), FIG. 4 shows block types and their classification for the H.264/AVC standard.

DETAILED DESCRIPTION OF THE INVENTION

Figure 1:
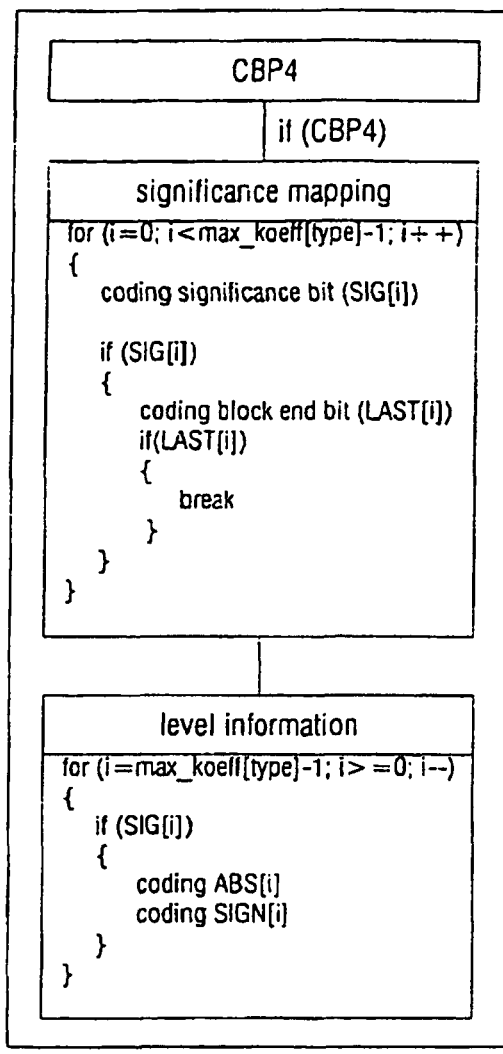
FIG. 1 is an illustration of the basic principle of coding transform coefficients according to the inventive coding method.

FIG. 1 illustrates the novel coding method. For each block of transform coefficients, a one-bit symbol CBP4 is transferred at first, unless higher order syntax elements (CBP or macro block mode) already indicate that the block considered does not contain any significant transform coefficients. The CBP4 symbol will be zero if there are no significant coefficients in the block. If it is one, a significance mapping specifying the position (in scan order) of the significant transform coefficients will be coded. Subsequently, the magnitude and the signs of the significant coefficients are transferred in a reverse scan order. A detailed description of the coding process will be given below in 1. Afterwards, context modeling for the binary arithmetic coding will be described in 2.

1. Description of the Coding of the Transform Coefficients
1.1 Scanning Transform Coefficients The transform coefficients of each block are mapped to a vector by means of a scan process (such as, for example, a zig zag scan).

1.2 CBP4 Symbol

CBP4 is a one-bit symbol indicating whether there are significant transform coefficients (transform coefficients unequal to zero) in a block. If the CBP4 symbol is zero, no further information for the corresponding block will be transferred.

1.3 Significance Mapping

If the CBP4 symbol indicates that the corresponding block contains significant coefficients, a significance mapping will be coded. This takes place by transferring a one-bit symbol (SIG) for each coefficient in the scan order. If a corresponding significance symbol is one (significant coefficient), another one-bit symbol (LAST) will be transferred. This symbol indicates whether the present significant coefficient is the last significant coefficient within a block or whether further significant coefficients follow. FIG. 2 shows two examples of the method described for coding the significance mapping. Significance information (SIG, LAST) will never be transferred for the last scan position of a block. If the transfer of the significance mapping has not already been terminated by a LAST symbol of one, it is obvious that the coefficient at the last scan position is significant (see yellow marked position in FIG. 2).

1.4 Level Information

The positions of the significant transform coefficients within a block are clearly specified by the significance mapping. The coding of the precise values of the coefficients (levels) takes place by two coding symbols: ABS (magnitude of the coefficients) and SIGN (sign of the coefficients). While SIGN represents a one-bit symbol, binarization according to FIG. 3 is used for coding the magnitudes of the coefficients (ABS). For coefficient magnitudes in the interval [1; 14], this binarization corresponds to a unary binarization. The binarization for coefficient magnitudes larger than 14 consists of a prefix part consisting of 14 ones and a suffix part representing a 0th order exp-golomb code for the symbol (ABS-15). Binarization does not include a representation for coefficient magnitudes (ABS) equaling 0, since significant coefficients (coefficients unequal to zero) will always have a magnitude (ABS) larger than or equal to one.

The binarization formed of a prefix part and a suffix part consisting of a 0th order exp-golomb code for coefficient magnitudes larger than 14 has the advantage that a special non-adaptive context with symbol probabilities 0.5 can be used without sacrificing in coding efficiency for all the binary decisions of the suffix part, whereby the amount of calculating for encoding and decoding can be reduced.

The levels are coded in a reverse scan order—beginning with the last significant coefficient within the block; this enables forming suitable context for the binary arithmetic coding.

2. Context Modeling

In general, different types of transform coefficient blocks are differentiated when considering a picture and/or video coding system. Thus, there are, for example, twelve types of transform coefficient blocks, having different statistics (the left column of table in FIG. 4) in the present Final Draft International Standard [1] of the H.264/AVC standard. For most picture sequences and coding conditions, some of the statistics are, however, very similar. In order to keep the number of contexts used small and thus to ensure a quick adaptation to the statistic of the picture sequence to be coded, the block types, in the H.264/AVC standard, can, for example, be classified into five categories (see right column of table in FIG. 4). Similar classifications are possible for other picture and/or video coding systems. For each of the—in the case of the H.264/AVC standard—five categories, an individual quantity of contexts is used for the symbols CBP4, SIG, LAST and ABS.

2.1 Context Modeling for the CBP4 Symbol

For coding the one-bit symbol CBP4, four different contexts are used for each individual category of transform blocks (see FIG. 4). The context number for block C to be coded is determined by i) ctx_number_cbp4(C)=CBP4(A)+2×CBP4(B)

wherein those neighboring blocks (left and top) of block C considered to be associated to the same block type are designated by A and B. Regarding the H.264/AVC standard, the following 6 block types are differentiated for this conditioning: Luma-DC, Luma-AC, Chroma-U-DC, Chroma-U-AC, Chroma-V-DC and Chroma-V-AC. If the concerning block X (A or B) of transform coefficients does not exist in a neighboring macro block (this is, for example, the case if the present block is coded in the INTRA16×16 mode, but the neighboring block has been transferred in an INTER mode), CBP4 (X) is set to zero for the neighboring block X. If a neighboring block X (A or B) is outside the picture area or belongs to another slice, the corresponding value CBP4 (X) is replaced by a default value. A default value of one is used for INTRA-coded blocks and a default value of zero is used for INTER-coded blocks.

2.2 Context Modeling for Coding the Significance Mapping

For coding the significance mapping, max_koeff-1 different contexts are each used per block category (see FIG. 4) for coding the symbols SIG and LAST. max_koeff thus designates the number of transform coefficients for the corresponding block category (for H.264/AVC, see FIG. 4). The context number is always indicated by the corresponding scan position of the coefficient considered. The context numbers of a coefficient koeff[i], which has been scanned as an i-th coefficient, thus result in:

i) ctx_number_sig(koeff[i])=ctx_number_last(koeff[i])=i.

2*max_koeff-2 contexts are used for each category of block types for coding the significance mapping.

2.3 Context Modeling for Coding Coefficient Magnitudes

The binarization illustrated in FIG. 3 is used for coding the magnitudes of the significant transform coefficients. Two different context quantities are used per block category, namely one for coding the first binary decision bin=1 (marked orange in FIG. 3) and another one for coding the binary decisions bin=2.14 (marked green in FIG. 3) of the binarization. The context numbers are thus associated as follows:

ctx_number_abs_1 bin
i)=(koeff with ABS>1 coded?4:
(1)max(3, number of coded coefficients with ABS=1)),
ctx_number_abs_rbins
i)=max(4, number of coded coefficients with ABS>1)).

The magnitudes of the transform coefficients are transferred in a reverse scan order. The context for the first binary decision is determined by the number of coefficients already transferred (in reverse scan order) having a magnitude of ABS=1. If more than three coefficients with a magnitude ABS=1 have already been transferred, context number 3 will always be chosen. As soon as a coefficient having a magnitude ABS>1 has been transferred, context 4 will be used for all the remaining significant coefficients within the block.

Figures 5, 6:
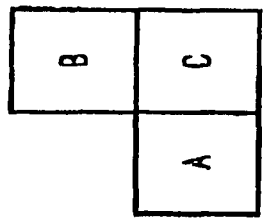
FIG. 5 shows context modeling for the one-bit symbol CBP4.
FIG. 6 shows examples of the context modeling for coding the magnitudes of the significant transform coefficients.

All binary decisions with bin=2.14 are coded using one and the same context. Thus, the context number is determined by the number of coefficients already coded (in a reverse scan order) having a magnitude of ABS>1, wherein the maximum context number is limited to 4. For illustration, two examples for the context selection, when coding the magnitudes ABS of the significant transform coefficients, are illustrated in FIG. 6. For coding the binary decision bin>14 for the coefficient magnitudes and for the signs SIGN, an individual non-adaptive context with the symbol probabilities $P_0=P_1=0.5$ is used.

The invention, in its embodiment, is not limited to the preferred embodiments indicated hereinbefore. A number of variations making use of the inventive arrangement and of the inventive method, even if the design is completely different, are feasible.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE LIST

[1] T. Wiegand, G. Sullivan, "Draft Text of Final Draft International Standard (FDIS) of Joint Video Specification (ITU-T Rec. H.264|ISO/IEC 14496-10 AVC)", JVT-G050, March 2003.

[2] ITU-T and ISO/IEC JTC1, "Generic coding of moving pictures and associated audio information—Part 2: Video", ITU-T Recommendation H.262-ISO/IEC 13818-2 (MPEG-2), November 1994

[3] ITU-T, "Video coding for low bitrate communications", ITU-T Recommendation H.263; version 1, November 1995, version 2, January 1998.

[4] ISO/IEC JTC1, "Coding of audio-visual objects—Part 2: Visual", ISO/IEC 14496-2 (MPEG-4 visual version 1), April 1999; Amendment 1 (version 2), February 2000; Amendment 4 (streaming profile), January 2001.

[5] C. A. Gonzales, "DCT coding of motion sequences including arithmetic coder", ISO-IEC/JTC1/SC2/WG8, MPEG 89/187, August 1989.

The invention claimed is:

1. A method, performed on a processor, for coding transform coefficients
wherein
for blocks of (video) pictures containing transform coefficients being unequal to zero, a coding of transform coefficients takes place in such a way that, for each block,
a significance map is coded, the significance map specifying the positions of transform coefficients being unequal to zero in the block in a scan order, and subsequently,
the values (levels) of the transform coefficients being unequal to zero are coded by, in a reverse scan order—starting with the last transform coefficient being unequal to zero within the block—binary entropy coding bins of a binarization of a magnitude of the transform coefficients being unequal to zero in a context-dependent way using contexts depending on how many transform coefficients having a magnitude of 1 have already been coded in the reverse scan order up to a respective currently coded transform coefficient, with coding all bins of the binarization of the respective currently to be coded transform coefficient being unequal to zero before proceeding with coding the bins of the binarization of a—in the reverse scan order—succeeding transform coefficient being unequal to zero.

2. The method according to claim 1,
wherein
when coding the significance map, each transform coefficient being unequal to zero in the scan order is characterized by a first one-bit symbol (SIG) serving to characterize transform coefficients being unequal to zero, i.e. each transform coefficient being unequal to zero including the last transform coefficient being unequal to zero in the scan order if it is different from the last transform coefficient of the block in the scan order, or excluding the last transform coefficient being unequal to zero in the scan order if it is the last transform coefficient of the block in the scan order, and the last transform coefficient being unequal to zero is characterized by a second one-bit symbol (LAST) indicating that the respective transform coefficient being unequal to zero is the last transform coefficient being unequal to zero in the scan order if it is different from the last transform coefficient of the block in the scan order.

3. The method according to claim 1, wherein for each transform coefficient being unequal to zero, the sign is indicated by a one-bit symbol (SIGN) and the magnitude is indicated by a binary-coded symbol (ABS).

4. The method according to claim 1, wherein the magnitude is indicated by a symbol (ABS) in unary binarization or by a symbol (ABS) having a prefix part and a suffix part, wherein the prefix part consists of ones and the suffix part is coded in a 0th order exp-golomb code.

5. The method according to claim 1, wherein by transferring a one-bit symbol (SIG) for each coefficient of a block and a one-bit symbol (LAST) for each transform coefficient being unequal to zero of a block, the significance map is coded, wherein the transfer takes place in the scan order, (SIG) serves for identifying transform coefficients being unequal to zero and (LAST) indicates whether there are further transform coefficients being unequal to zero in the block.

6. The method according to claim 5, wherein no significance information (SIG, LAST) is transferred for the last scan position of a block.

7. The method according to claim 1, wherein blocks containing transform coefficients being unequal to zero are characterized by a one-bit symbol (CBP4) in connection with further syntax elements, including (CBP) or macro block mode.

8. The method according to claim 7, wherein modeling
for the one-bit symbol (CBP4),
for coding the significance map and/or
for coding the coefficient magnitudes
takes place in a context-dependent way.

9. The method according to claim 1, wherein block types of transform coefficients having comparable statistics are summarized to block categories.

10. An arrangement having at least one processor and/or chip formed such that a method for coding transform coefficients can be performed, wherein
for blocks of (video) pictures containing transform coefficients being unequal to zero, a coding of transform coefficients takes place in such a way that, for each block,
a significance map is coded, the significance map specifying the positions of transform coefficients being unequal to zero in the block in a scan order, and subsequently,
the values (levels) of the transform coefficients being unequal to zero are coded by, in a reverse scan order—starting with the last transform coefficient being unequal to zero within the block—binary entropy coding bins of a binarization of a magnitude of the transform coefficients being unequal to zero in a context-dependent way using contexts depending on how many coefficients having a magnitude of 1 have already been coded in the reverse scan order with coding all bins of the binarization of the respective currently to be coded transform coefficient being unequal to zero before proceeding with coding the bins of the binarization of a—in the reverse scan order—succeeding transform coefficient being unequal to zero.

11. A non-transitory computer-readable storage medium on which a program is stored, enabling a computer, after having been loaded into the memory of the computer, to perform a method for coding transform coefficients, wherein
for blocks of (video) pictures containing transform coefficients being unequal to zero, a coding of transform coefficients takes place in such a way that, for each block,
a significance map is coded, the significance map specifying the positions of transform coefficients being unequal to zero in the block in a scan order, and subsequently,
the values (levels) of the transform coefficients being unequal to zero are coded by, in a reverse scan order—starting with the last transform coefficient being unequal to zero within the block—binary entropy coding bins of a binarization of a magnitude of the transform coefficients being unequal to zero in a context-dependent way using contexts depending on how many transform coefficients having a magnitude of 1 have already been coded in the reverse scan order with coding all bins of the binarization of the respective currently to be coded transform coefficient being unequal to zero before proceeding with coding the bins of the binarization of a—in the reverse scan order—succeeding transform coefficient being unequal to zero.

12. A method, performed on a processor, for decoding a coding of a significance map and a subsequent coding of values of transform coefficients being unequal to zero for blocks of (video) pictures containing transform coefficients being unequal to zero, the significance map specifying the positions of the transform coefficients being unequal to zero in a scan order, and the coding of values of transform coefficients being unequal to zero comprising coded values of the transform coefficients being unequal to zero in a reverse scan order—starting with the last transform coefficient being unequal to zero, comprising the steps of:
decoding the significance mapping in the scan order; and
decoding the coded values of transform coefficients being unequal to zero by, in the reverse scan order, binary entropy decoding bins of a binarization of a magnitude of the transform coefficients being unequal to zero in a context-dependent way using contexts depending on how many transform coefficients having a magnitude of 1 have already been decoded in the reverse scan up to the respective currently decoded transform coefficient, with decoding all bins of the binarization of the respective currently to be decoded transform coefficient being unequal to zero before proceeding with decoding the bins of the binarization of a—in the reverse scan order—succeeding transform coefficient being unequal to zero.

13. The method according to claim 12, wherein the significance mapping specifies the positions of the transform coefficients being unequal to zero in a scan order and comprises, in the scan order, —except for the last scan position in the scan order—a one-bit symbol (SIG) for each coefficient of the block and a one-bit symbol (LAST) for each significant coefficient of the block, wherein (SIG) serves for identifying significant coefficients and (LAST) indicates whether there are further significant transform coefficients in the block, wherein the decoding the significance mapping comprises decoding the symbols SIG and LAST context-adaptively by use of context numbers indicated by the corresponding scan position of the transform coefficient considered.

14. The method according to claim 12, wherein decoding the significance mapping and decoding the values of the coded transform coefficients is performed by arithmetical decoding.

15. The method according to claim 12, wherein a magnitude of a each coded transform coefficient is binarized into a sequence of bins and decoding the coded transform coefficients in the reverse scan order comprises
determining a context for the first bin of the magnitude of each coded transform coefficient based on a number of transform coefficients already decoded in the reverse scan order having a magnitude of 1,
context-adaptively coding the first bins of the transform coefficients using the determined contexts.

16. The method according to claim 15, wherein the determination of a context for the first bin of the magnitude of each transform coefficient is performed such that a first predetermined context is used as soon as more than three coded transform coefficients with a magnitude of 1 have been decoded, and a second predetermined context for all remaining coded transform coefficients being unequal to zero within the block is used, as soon as a coded transform coefficient having a magnitude greater than 1 has been coded.

17. The method according to claim 15, wherein decoding the coded transform coefficients in the reverse scan order also comprises
determining a context number for a second to fourteenth bin of the magnitude of each coded transform coefficient by a number of coded transform coefficients already decoded in the reverse scan order having a magnitude of greater than 1;
context-adaptively decoding the second to fourteenth bins of the coded transform coefficients using the context numbers determined.

18. The method according to claim 15, wherein decoding the coded transform coefficients in the reverse scan order also comprises
decoding x-th bins with x>14 of the magnitude of the transform coefficients using a non-adaptive context.

19. A decoder for decoding a significance map and values of transform coefficients being unequal to zero for blocks of (video) pictures containing transform coefficients being unequal to zero, the significance map specifying the positions of the transform coefficients being unequal to zero from a data stream, the decoder being configured to
decode a significance mapping specifying positions of the transform coefficients being unequal to zero in a scan order from the bitstream in the scan order; and
subsequent to decoding the significance map, decode the values of transform coefficients being unequal to zero from the data stream by, in the reverse scan order—starting with the last transform coefficient being unequal to zero—, binary entropy decoding bins of a binarization of a magnitude of the transform coefficients being unequal to zero in a context-dependent way using contexts depending on how many transform coefficients having a magnitude of 1 have already been decoded in the reverse scan order up to a respective currently decoded transform coefficient, with decoding all bins of the binarization of the respective currently to be decoded transform coefficient being unequal to zero before proceeding with decoding the bins of the binarization of a—in the reverse scan order—succeeding transform coefficient being unequal to zero.

20. A decoder for decoding values of transform coefficients being unequal to zero for blocks of (video) pictures containing transform coefficients being unequal to zero from a data stream, the video decoder having at least one processor and/or chip being configured to:
decode a significance mapping specifying, in a scan order, the positions of the transform coefficients being unequal to zero, in the scan order; and
subsequent to decoding the significance map, decode the values of transform coefficients being unequal to zero by, in the reverse scan order—starting with the last transform coefficient being unequal to zero—, binary entropy decoding bins of a binarization of a magnitude of the transform coefficients being unequal to zero in a context-dependent way using contexts depending on how many transform coefficients having a magnitude of 1 have already been decoded in the reverse scan order up to a respective currently decoded transform coefficient, with decoding all bins of the binarization of the respective currently to be decoded transform coefficient being unequal to zero before proceeding with decoding the bins of the binarization of a—in the reverse scan order—succeeding transform coefficient being unequal to zero.

21. The method according to claim 1, comprising counting as to how many transform coefficients having a magnitude of 1 have already been coded in the reverse scan order up to the respective currently coded transform coefficient to obtain a count, and selecting a context for the respective currently coded transform coefficient out of a set of available contexts using the count.

22. The method according to claim 1, wherein, in the coding of the values (levels) of the transform coefficients being unequal to zero in the reverse scan order, the transform coefficients being equal to zero along the reverse scan order are skipped.

23. The method according to claim 1,
wherein coding the significance map comprises:
traversing the transform coefficients in the scan order with
for a currently traversed transform coefficient, coding a first one-bit symbol (SIG) signaling as to whether the currently traversed transform coefficient is equal to zero or unequal to zero;
if the currently traversed transform coefficient is non-zero and is different from the last transform coefficient of the block in the scan order, coding a second one-bit symbol (LAST) indicating as to whether the currently traversed transform coefficient being unequal to zero is the last transform coefficient being unequal to zero in the scan order;
wherein the first and second one-bit symbols are coded using contexts depending on the scan position of the currently traversed transform coefficient measured as a rank of the scan position of the currently traversed transform coefficient in the scan order.

24. The method according to claim 12, comprising counting as to how many transform coefficients having a magnitude of 1 have already been decoded in the reverse scan order up to the respective currently decoded transform coefficient to obtain a count, and selecting a context for the respective currently decoded transform coefficient out of a set of available contexts using the count.

25. The method according to claim 12, wherein, in the decoding of the coded values (levels) of the transform coefficients being unequal to zero in the reverse scan order, the transform coefficients being equal to zero along the reverse scan order are skipped.

26. The method according to claim 12,
wherein decoding the significance map comprises:
traversing the transform coefficients in the scan order with
for a currently traversed transform coefficient, decoding a first one-bit symbol (SIG) signaling as to whether the currently traversed transform coefficient is equal to zero or unequal to zero;
if the currently traversed transform coefficient is non-zero and is different from the last transform coefficient of the block in the scan order, decoding a second one-bit symbol (LAST) indicating as to whether the currently traversed transform coefficient being unequal to zero is the last transform coefficient being unequal to zero in the scan order;
wherein the first and second one-bit symbols are decoded using contexts depending on the scan position of the currently traversed transform coefficient measured as a rank of the scan position of the currently traversed transform coefficient in the scan order.

27. The decoder according to claim 19, wherein the decoder is further configured to count as to how many transform coefficients having a magnitude of 1 have already been decoded in the reverse scan order up to the respective currently decoded transform coefficient to obtain a count, and select a context for the respective currently decoded transform coefficient out of a set of available contexts using the count.

28. The decoder according to claim 19, wherein the decoder is further configured to, in the decoding of the values (levels) of the transform coefficients being unequal to zero in the reverse scan order, skip the transform coefficients being equal to zero along the reverse scan order.

29. The decoder according to claim 19,
wherein the decoder is further configured to, in decoding the significance map,
traverse the transform coefficients in the scan order with
for a currently traversed transform coefficient, decoding a first one-bit symbol (SIG) signaling as to whether the currently traversed transform coefficient is equal to zero or unequal to zero;
if the currently traversed transform coefficient is non-zero and is different from the last transform coefficient of the block in the scan order, decoding a second one-bit symbol (LAST) indicating as to whether the currently traversed transform coefficient being unequal to zero is the last transform coefficient being unequal to zero in the scan order;
decode the first and second one-bit symbols using contexts depending on the scan position of the currently traversed transform coefficient measured as a rank of the scan position of the currently traversed transform coefficient in the scan order.

\* \* \* \* \*

UNITED STATES PATENT AND TRADEMARK OFFICE
CERTIFICATE OF CORRECTION

PATENT NO. : 9,450,608 B2
APPLICATION NO. : 12/428154
DATED : September 20, 2016
INVENTOR(S) : Heiko Schwarz et al.

It is certified that error appears in the above-identified patent and that said Letters Patent is hereby corrected as shown below:

On the Title Page

Item (73) Assignee should be corrected to read:
Fraunhofer-Gesellschaft zur Foerderung der angewandten Forschung e.V., Muenchen (DE)

Signed and Sealed this
Twenty-seventh Day of March, 2018

Andrei Iancu
*Director of the United States Patent and Trademark Office*